(12) United States Patent
Cheah et al.

(10) Patent No.: US 10,354,957 B2
(45) Date of Patent: Jul. 16, 2019

(54) ELECTRICAL INTERCONNECT FOR A FLEXIBLE ELECTRONIC PACKAGE

(71) Applicant: Intel Corporation, Santa Clara, CA (US)

(72) Inventors: Bok Eng Cheah, Bukit Gambir (MY); Jackson Chung Peng Kong, Tanjung Tokong (MY); Stephen Harvey Hall, Forest Grove, OR (US); Khang Choong Yong, Puchong (MY); Kooi Chi Ooi, Glugor (MY); Eric C Gantner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/778,379

(22) PCT Filed: Nov. 25, 2015

(86) PCT No.: PCT/US2015/062720
§ 371 (c)(1),
(2) Date: May 23, 2018

(87) PCT Pub. No.: WO2017/091229
PCT Pub. Date: Jun. 1, 2017

(65) Prior Publication Data
US 2018/0350748 A1 Dec. 6, 2018

(51) Int. Cl.
*H01L 23/495* (2006.01)
*H01L 23/538* (2006.01)
(Continued)

(52) U.S. Cl.
CPC ........ *H01L 23/5386* (2013.01); *H01L 21/561* (2013.01); *H01L 21/565* (2013.01);
(Continued)

(58) Field of Classification Search
USPC ... 257/664, E21.499, E23.01, E25.013, 213, 257/777, 784, 48, 698, 723, 737, 773,
(Continued)

(56) References Cited

U.S. PATENT DOCUMENTS 9,520,372 B1 * 12/2016 Jeng .................. H01L 21/02164
2005/0237137 A1 10/2005 Dutta et al.
(Continued)

FOREIGN PATENT DOCUMENTS

JP 2008109331 A 5/2008
JP 2013239511 * 11/2013
(Continued)

OTHER PUBLICATIONS

"International Application Serial No. PCT/US2015/062720, International Search Report dated Aug. 12, 2016", 5 pgs.
(Continued)

*Primary Examiner* — Niki H Nguyen
(74) *Attorney, Agent, or Firm* — Schwegman Lundberg & Woessner, P.A.

(57) ABSTRACT

An electrical interconnect for an electronic package. The electrical interconnect includes a first dielectric layer; a second dielectric layer; a signal conductor positioned between the first dielectric layer and the second dielectric layer; and a conductive reference layer mounted on the first dielectric layer, and wherein the conductive reference layer does not cover the signal conductor. The conductive reference layer may be a first conductive reference layer and the electrical interconnect further comprises a second conductive reference layer mounted on the second dielectric layer. The second conductive reference layer does not cover the signal conductor. In addition, the signal conductor may be a first signal conductor and the electrical interconnect may further include a second signal conductor between the first
(Continued)

dielectric layer and the second dielectric layer. The first and second signal conductors may form a differential pair of conductors.

9 Claims, 5 Drawing Sheets

(51) Int. Cl.
      *H05K 1/02*       (2006.01)
      *H01L 21/56*      (2006.01)
      *H01L 23/66*      (2006.01)
      *H01L 25/065*     (2006.01)
      *H01L 25/18*      (2006.01)
      *H01L 25/00*      (2006.01)
      *H05K 1/18*       (2006.01)

(52) U.S. Cl.
    CPC ...... *H01L 23/5381* (2013.01); *H01L 23/5387* (2013.01); *H01L 23/5389* (2013.01); *H01L 23/66* (2013.01); *H01L 25/0655* (2013.01); *H01L 25/18* (2013.01); *H01L 25/50* (2013.01); *H05K 1/0253* (2013.01); *H01L 2223/6638* (2013.01); *H05K 1/0225* (2013.01); *H05K 1/0245* (2013.01); *H05K 1/189* (2013.01)

(58) Field of Classification Search
    USPC .................. 257/738; 438/109, 107, 125, 566
    See application file for complete search history.

(56) References Cited

U.S. PATENT DOCUMENTS

2009/0255715 A1   10/2009  Dangler et al.
2010/0238638 A1*  9/2010   Cho .................. H01L 23/49838
                                                         361/767
2013/0175686 A1*  7/2013   Meyer ................ H01L 25/0655
                                                           257/738

FOREIGN PATENT DOCUMENTS

JP           2013239511 A     11/2013
WO    WO-2017091229 A1   6/2017

OTHER PUBLICATIONS

"International Application Serial No. PCT/US2015/062720, Written Opinion dated Aug. 12, 2016", 10 pgs.

* cited by examiner

FIG. 11 ized form factor and more compact package & PCB designs.

ELECTRICAL INTERCONNECT FOR A FLEXIBLE ELECTRONIC PACKAGE

CROSS-REFERENCE TO RELATED APPLICATION

This application is a U.S. National Stage Filing under 35 U.S.C. 371 from International Application No. PCT/US2015/062720, filed on Nov. 25, 2015, and published as WO 2017/091229, which application is incorporated herein by reference in its entirety.

TECHNICAL FIELD

Embodiments described herein generally relate to electronic packages, and more particularly to an electrical interconnect for a flexible electronic package.

BACKGROUND

Electronic devices (e.g., mobile phones, smart phones, tablet computers, wearables, etc.) are continually being designed to be more flexible, compact and portable. Therefore, it is extremely important to reduce the form factor, z-height, stiffness and weight of the electronic devices that are included in mobile products.

One of the concerns that can arise as things are made smaller is signal integrity issues. As examples, channel impedance discontinuity and crosstalk are common issues that are continually addressed during high-speed package and PCB design.

In some electronic devices, signal crosstalk, reflection and loss are common issues that occur in conventional systems which include differential pairs of conductors. Signal crosstalk, reflection and loss may have negative design impacts by limiting bus design scaling (e.g., frequency, power, silicon real-estate, package layer-count and channel length).

Conventional solutions that seek to mitigate signal integrity issues typically require some form of design trade-off. One or more of these design trade-offs usually constrain enabling smaller and more flexible form factor high-speed packages and PCBs.

As a first example, high-speed packages and PCBs may increase the layer count and/or Z-height of the high-speed packages and PCBs. The number of signal routing layers and referencing layers may be increased to alleviate the signal integrity issues (e.g., due to breakout/congested routing areas or routing-over-void/split-plane areas).

As a second example, high-speed packages and PCBs may reduce routing density (i.e., increase in routing pitch). The layout of high-speed packages and PCBs may be optimized to reduce signal integrity issues by keeping interconnects with at least 2x-spacing away from one another to (i) reduce crosstalk; and (ii) have a transition to other routing layer to avoid routing over-void/split-plane areas.

As a third example, high-speed packages and PCBs may require an increase in power consumption. This increase in power consumption is typically combined with circuit patterns where active crosstalk cancellation, terminations and loss equalization are applied to mitigate crosstalk, reflection and loss.

Therefore, a need exists for a flexible interconnect structure that may address channel impedance discontinuity/reflection, crosstalk and loss issues while minimizing any design trade-offs. Addressing channel impedance discontinuity/reflection, crosstalk and loss issues while minimizing any design trade-offs may enable smaller and more flexible form factor and more compact package & PCB designs. Smaller and more flexible form factor and more compact package & PCB designs may be especially important in mobile applications such as Wearables, Tablets, Smartphones and Ultrabooks (among other electronic devices).

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the electrical interconnect or electronic package.

The electrical interconnects and electronic systems described herein may address issues that are associated with form-factor scaling of high speed interconnect designs when using flexible printed circuit technology. The electrical interconnects and electronics systems described herein may be used in applications such as wearables, mobile devices and other computer devices, especially those devices with non-standard form-factors or modular systems.

The electrical interconnects and electronic systems described herein may reduce impedance mismatching without corresponding design tradeoffs in routing density and/or layer count. In addition, the electrical interconnects and electronic systems described herein may be selectively, or uniformly, applied to particular regions of a flexible electronic package. It should be noted that the electrical interconnects and electronic systems may additionally, or alternatively, minimize cross talk, reflection and loss while maintaining target impedance when there is congested trace-to-trace spacing.

The electrical interconnects and electronic systems described herein may provide improved flexibility because of a reduction in the amount of metal as compared to conventional reference planes. In addition, the electrical interconnects and electronic systems may provide for z-height reduction in flexible substrates, including but not limited to flexible printed circuit boards.

Figure 1:
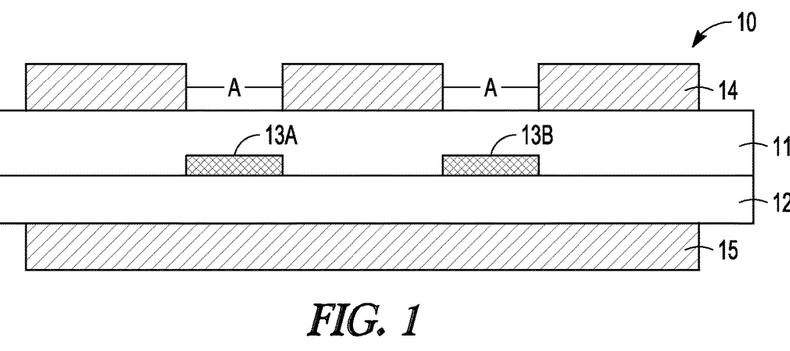
FIG. 1 illustrates a schematic side view of an example electrical interconnect for an electronic package.
Figure 2:
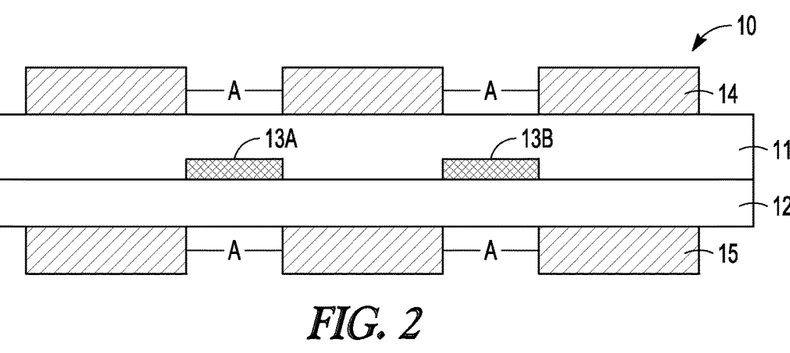
FIG. 2 illustrates a schematic side view of another example electrical interconnect for an electronic package.
Figure 3:
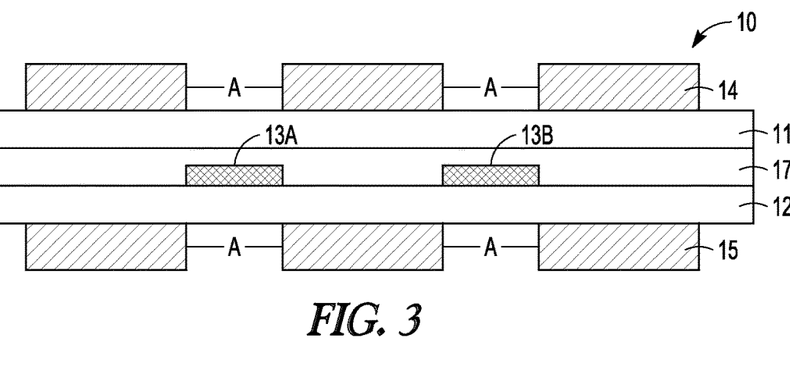
FIG. 3 illustrates a schematic side view of still another example electrical interconnect for an electronic package.

FIGS. 1 and 2 illustrate a schematic side view of different forms of an example electrical interconnect 10 for an electronic package. The electrical interconnect 10 includes a first dielectric layer 11, a second dielectric 12 and a signal conductor 13A positioned between the first dielectric layer 11 and the second dielectric layer 12. In some forms, the first and second dielectric layers 11, 12 may include a flexible polymer (e.g., a polyimide material—among other types of materials).

The electrical interconnect 10 further includes a conductive reference layer 14 mounted on the first dielectric layer 11. The conductive reference layer 14 does not cover the signal conductor 13A.

It should be noted that the conductive reference layer 14 may not cover a portion, all or more than the signal conductor 13A. In other words, the voids A may be narrower, wider or the same size as signal conductor 13A (see voids A in the FIGS.).

FIGS. 1 and 2 show an example form of the electrical interconnect 10 where the conductive reference layer 14 is a first conductive reference layer 14 and the electrical interconnect 10 further comprises a second conductive reference layer 15 mounted on the second dielectric layer 12. In the example form of the electrical interconnect 10 shown in FIG. 1, the second conductive reference layer covers the signal conductor 13A. In the example electrical interconnect 10 shown in FIG. 2, the second conductive reference layer 15 does not cover the signal conductor 13A. It should be noted that forms of the electrical interconnect 10 are contemplated that do not include a second conductive reference layer 15.

FIGS. 1 and 2 show an example form of the electrical interconnect where the signal conductor 13A is a first signal conductor 13A and the electrical interconnect 10 further includes a second signal conductor 13B between the first dielectric layer 11 and the second dielectric layer 12. It should be noted that the first and second signal conductor 13A, 13B may be the same or different depending on the application where the electrical interconnect 10 is to be used. In addition, the first signal conductor 13A and the second signal conductor 13B may form a differential pair of conductors.

The example electrical interconnect 10 shown in FIG. 2 has first and second conductive reference layers 14, 15 that do not cover the first and second signal conductors 13A, 13B. The voided first and second conductive reference layers may be fabricated through photo-resistant development and etching techniques (among other types of example processes).

Figure 4:
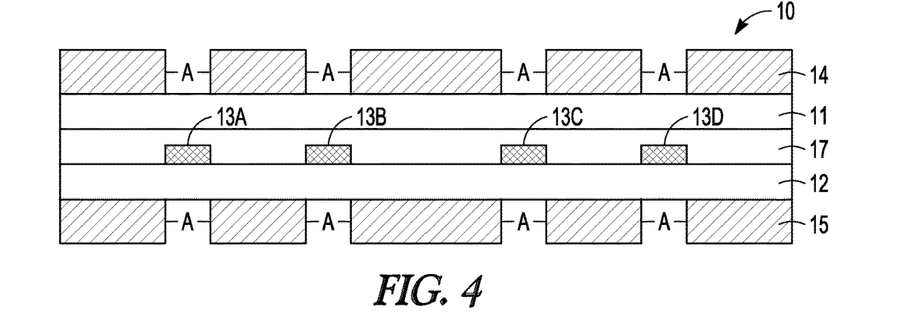
FIG. 4 illustrates a schematic side view of an example electrical interconnect for an electronic package where signal conductors are equally spaced apart.
Figure 5:
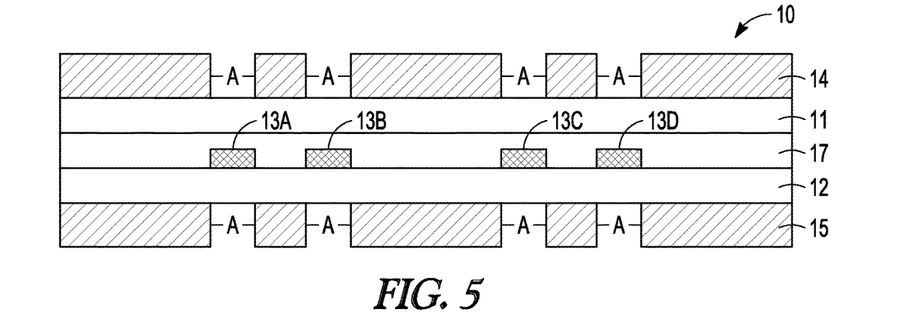
FIG. 5 illustrates a schematic side view of an example electrical interconnect similar to FIG. 4 where signal conductors are not equally spaced apart.
Figure 6:
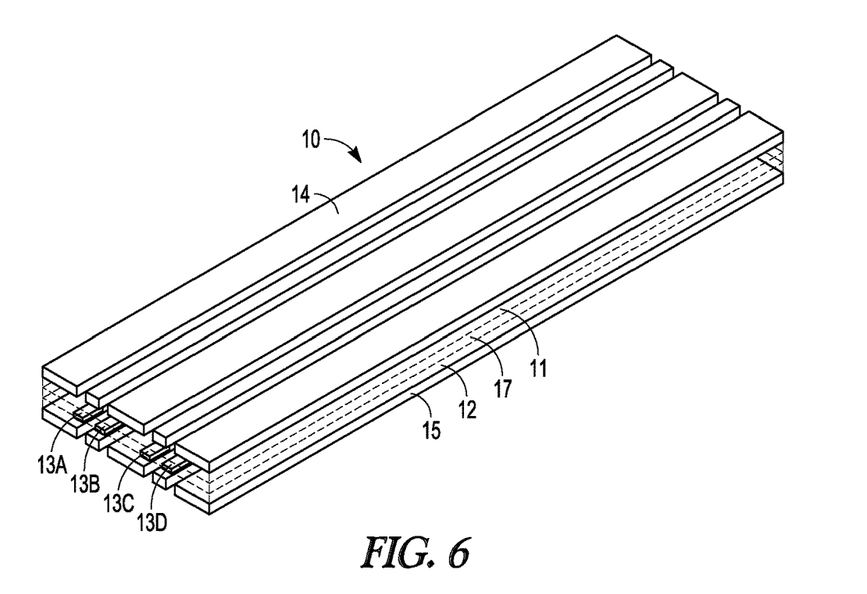
FIG. 6 is a perspective view of the example electrical interconnect shown in FIG. 5.

FIGS. 4 and 5 illustrate schematic side views of other forms of the example electrical interconnect 10. FIG. 6 is a perspective view of the example electrical interconnect 10 shown in FIG. 5. The electrical interconnect 10 may include a plurality of additional signal conductors 13C, 13D. Each of the additional signal conductors 13C, 13D is between the first dielectric layer 11 and the second dielectric layer 12.

It should be noted that each one of the plurality of additional signal conductors 13C, 13D may be part of differential pair of conductors. As an example, each signal conductor may be closely adjacent to another signal conductor to form the differential pair of conductors.

A comparison of FIGS. 4 and 5 illustrates that in FIG. 4 the signal conductors 13A, 13B and signal conductors 13C, 13D may not form a differential pair. In contrast, the electrical interconnect 10 in FIG. 5 shows where the signal conductors 13A, 13B form a differential pair and the signal conductors 13C, 13D also form a differential pair.

In the example electrical interconnects 10 shown in FIGS. 4 and 5, the first and second conductive reference layers do not cover each of the signal conductors 13A, 13B, 13C, 13D. It should be noted that forms of the electrical interconnect 10 are contemplated where certain signal conductors are covered (partially or fully) by one, or both, of the first and second conductive reference layers 14, 15.

In some forms, the first and second conductive reference layers 14, 15 may permit the transmission of high-speed differential signals (e.g., up to 10 gigabytes per second), In addition, the electrical interconnects 10 described herein may have improved flexibility.

In the illustrated example electrical interconnects 10 shown in FIGS. 1-8, the signal conductors are shown as being linear. It should be noted that other shapes for the signal conductors are contemplated. As examples, the signal conductors may be curved, serpentine and may even be oriented in three dimensions.

Figure 7:
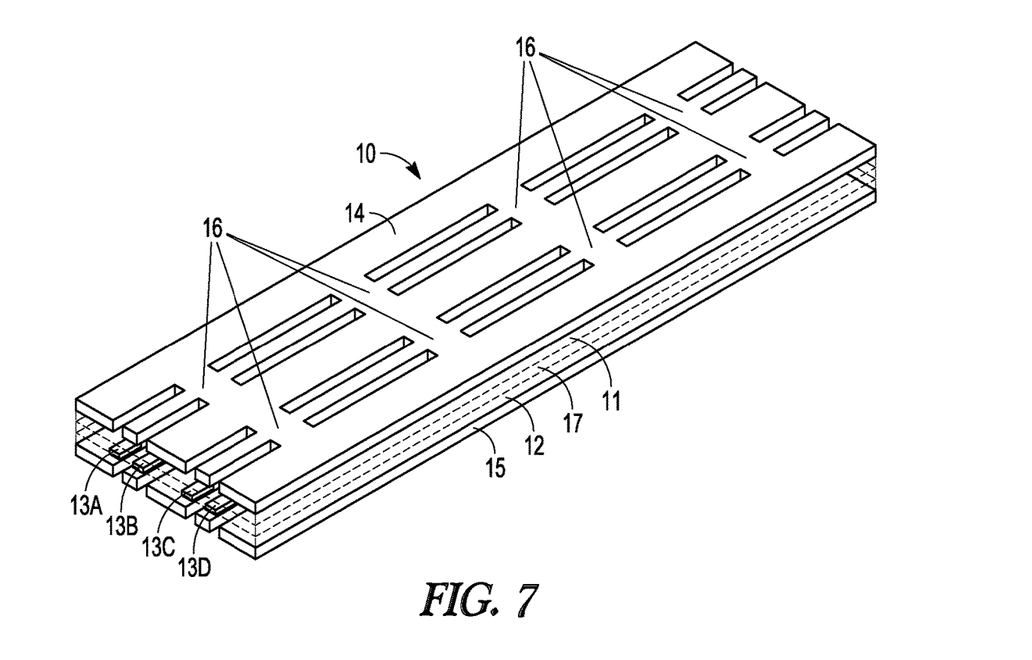
FIG. 7 is a perspective view similar to FIG. 6 where the example electrical interconnect includes aligned bridge sections.
Figure 8:
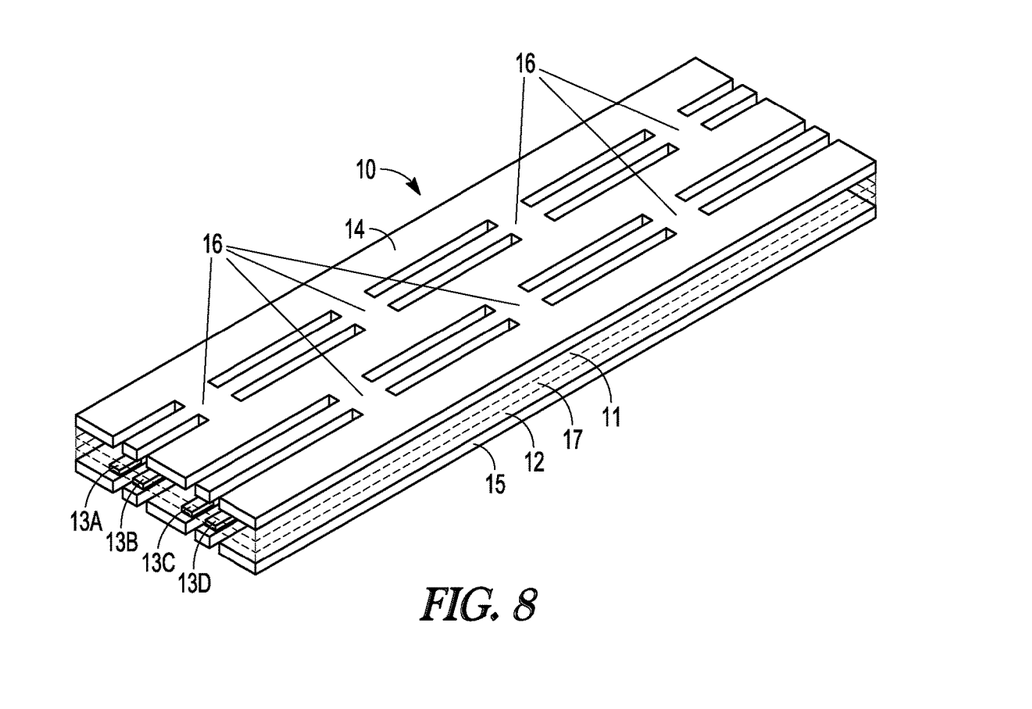
FIG. 8 is a perspective view similar to FIG. 6 where the example electrical interconnect includes bridge sections that are not aligned.

As shown in FIGS. 7 and 8, the first and second conductive reference layers 14, 15 of the example electrical interconnects 10 may include bridge sections 16 that periodically cover differential pairs of signal conductors (see differential pair 13A, 13B and differential pair 13C, 13D). It should be noted that the distance between bridge sections 16 will depend in part on the wavelength of the signals that are being carried by the signal conductors 13A, 13B, 13C, 13D at a particular frequency.

In the example electrical interconnect 10 shown in FIG. 7, the bridge sections 16 that cover one differential pair of signal conductors 13A, 13B are aligned with the bridge sections 16 that cover another differential pair of signal conductors 13C, 13D. In the example electrical interconnect 10 shown in FIG. 8, the bridge sections 16 that cover one differential pair of signal conductors 13A, 13B are not aligned with the bridge sections 16 that cover an adjacent differential pair of signal conductors 13C, 13D.

FIGS. 3-8 illustrate example electrical interconnects 10 that further include an adhesive layer 17 that is positioned between the first dielectric layer 11 and the second dielectric layer 12. It should be noted that the thickness and type of adhesive layer 17 that is used in the electrical interconnects 10 will depend in part on the manufacturing processes that are used to fabricate the electrical interconnects 10 as well as the applications where the electrical interconnects 10 are to be used (among other factors). In some forms, the adhesive layer 17 may be a polyimide-based adhesive layer.

The FIGS. 9A-9F illustrate progressive schematic side views of a process for forming an electronic system 90 that includes one or more of the electrical interconnects 10 that are shown and described herein. The electronic system 10 includes a first electronic system 90 that includes a first electronic component 91 and a second electronic component 92. The first electronic component 91 is electrically connected to the second electronic component 92 by one of the electrical interconnects 10 described herein.

It should be noted that any type of electronic component (e.g., active or passive) that is known now, or discovered in the future, may be utilized in the electronic system 90. In some forms, the electronic component may take the form of a stack of electronic components (see, e.g., electronic component 92 in FIGS. 9 and 10). The types of electronic components that are included in the electronic system 90 will depend in part on the application where the electronic system 90 is to be used (among other factors).

Figure 9A:
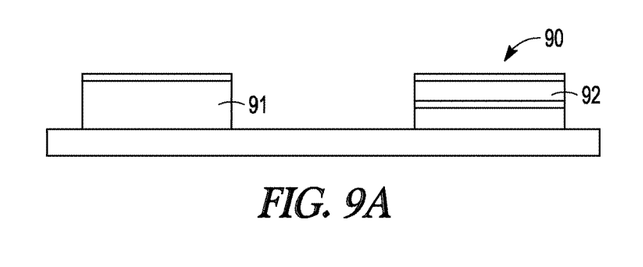
FIGS. 9A-9F illustrate progressive schematic side views of a process for forming an electronic system that includes one or more of the electrical interconnects that are shown and described herein.
Figure 9B:
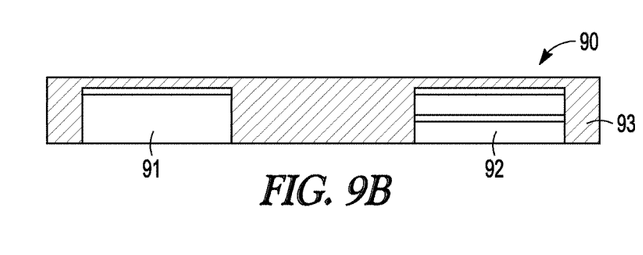
Figure 9C:
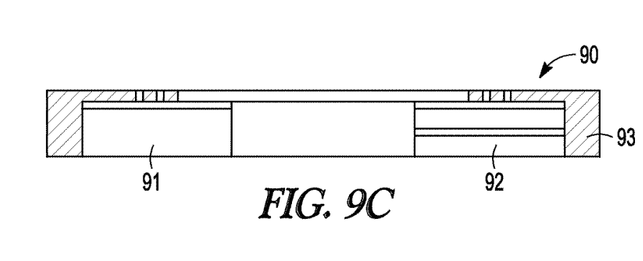
Figure 9D:
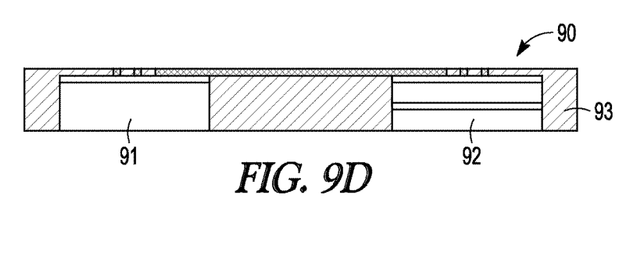
Figure 9E:
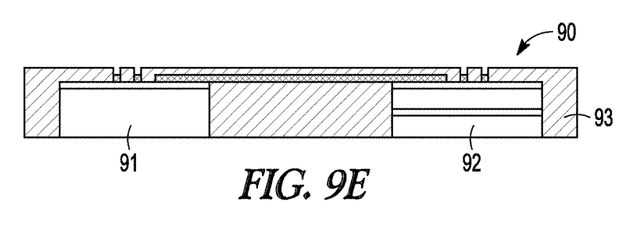
Figure 9F:
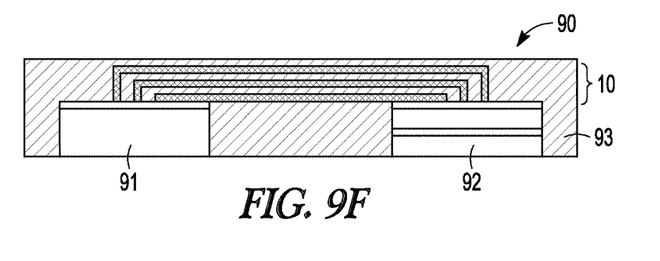
Figure 10:
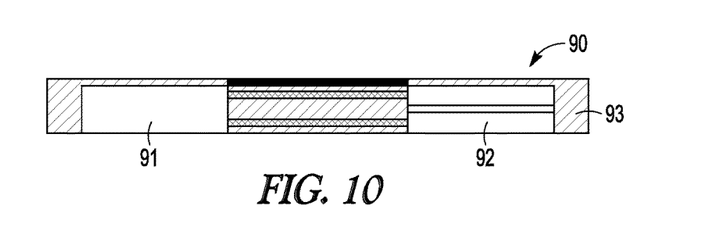
FIG. 10 illustrates a schematic side view of another electronic system that includes one or more of the electrical interconnects that are shown and described herein.

In the example electronic system 90 shown in FIG. 9F, the electrical interconnect 10 is mounted and/or built onto a flexible substrate 93 that includes the first and second electronic components 91, 92. In the example electronic system 90 shown in FIG. 10, the electrical interconnect 10 is part of the flexible substrate 93 that includes the first and second electronic components 91, 92.

It should be noted that the electronic systems 90 described herein may include multiple electrical interconnects 10 that provide electrical interconnects for a variety of electronic components. In addition, the electrical interconnects 10 may be part of the same flexible substrate as the electronic components and/or mounted to a top and/or bottom side of a flexible substrate depending on the application where the electronic system 90 is to be used (among other factors).

Figure 11:
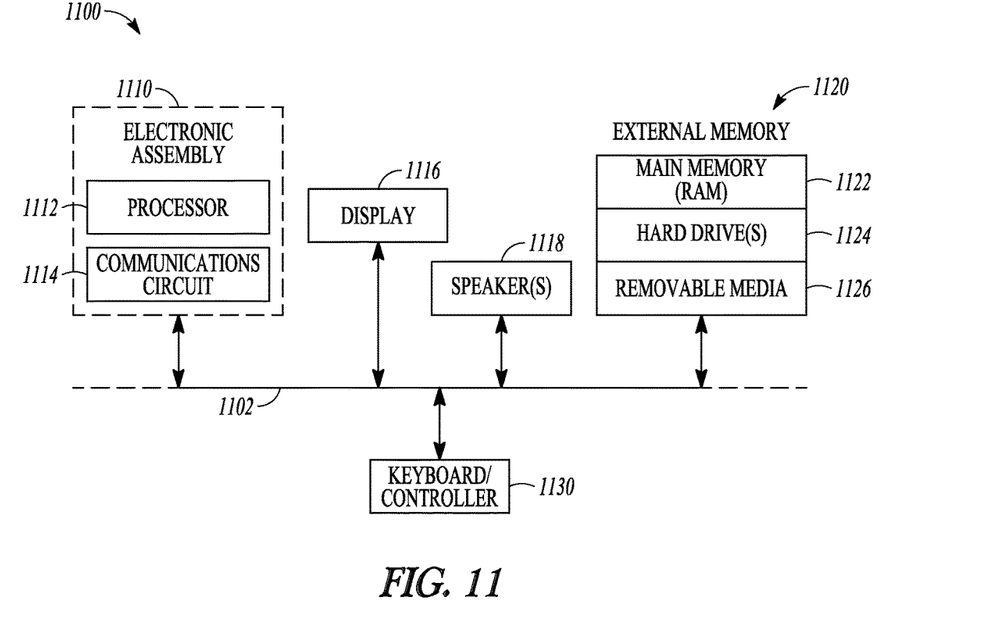
FIG. 11 is a block diagram of an electronic apparatus that includes the electrical interconnects and/or electronic systems described herein.

FIG. 11 is a block diagram of an electronic apparatus 1100 incorporating at least one electrical interconnect 10 and/or electronic system 90 described herein. Electronic apparatus 1100 is merely one example of an electronic apparatus in which forms of the electrical interconnects 10 and/or electronic systems 90 may be used.

Examples of an electronic apparatus 1100 include, but are not limited to, personal computers, tablet computers, mobile telephones, wearables, drones, game devices, MP3 or other digital music players, etc. In this example, electronic apparatus 1100 comprises a data processing system that includes a system bus 1102 to couple the various components of the electronic apparatus 1100. System bus 1102 provides communications links among the various components of the electronic apparatus 1100 and may be implemented as a single bus, as a combination of busses, or in any other suitable manner.

An electronic assembly 1110 that includes any of the electrical interconnects 10 and/or electronic systems 90 as describe herein may be coupled to (or form part of) system bus 1102. The electronic assembly 1110 may include any circuit or combination of circuits. In one embodiment, the electronic assembly 1110 includes a processor 1112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1110 are a custom circuit, an application-specific integrated circuit (ASIC), or the like, such as, for example, one or more circuits (such as a communications circuit 1114) for use in wireless devices like mobile telephones, tablet computers, laptop computers, two-way radios, and similar electronic systems. The IC can perform any other type of function.

The electronic apparatus 1100 may also include an external memory 1120, which in turn may include one or more memory elements suitable to the particular application, such as a main memory 1122 in the form of random access memory (RAM), one or more hard drives 1124, and/or one or more drives that handle removable media 1126 such as compact disks (CD), flash memory cards, digital video disk (DVD), and the like.

The electronic apparatus 1100 may also include a display device 1116, one or more speakers 1118, and a keyboard and/or controller 1130, which can include a mouse, trackball, touch screen, voice-recognition device, or any other device that permits a system user to input information into and receive information from the electronic apparatus 1100.

To better illustrate the electrical interconnects 10 and/or electronic systems 90 disclosed herein, a non-limiting list of embodiments is provided herein:

Example 1 includes an electrical interconnect for an electronic package. The electrical interconnect includes a first dielectric layer; a second dielectric layer; a signal conductor positioned between the first dielectric layer and the second dielectric layer; and a conductive reference layer mounted on the first dielectric layer, and wherein the conductive reference layer does not cover the signal conductor.

Example 2 includes the electrical interconnect of example 1, wherein the conductive reference layer does not cover a portion of the signal conductor.

Example 3 includes the electrical interconnect of any one of examples 1 to 2, wherein the conductive reference layer is a first conductive reference layer and the electrical interconnect further comprises a second conductive reference layer mounted on the second dielectric layer.

Example 4 includes the electrical interconnect of example 3, wherein the second conductive reference layer does not cover the signal conductor.

Example 5 includes the electrical interconnect of any one of examples 1 to 4, wherein the signal conductor is a first signal conductor and the electrical interconnect further comprises a second signal conductor between the first dielectric layer and the second dielectric layer.

Example 6 includes the electrical interconnect of any one of examples 1 to 5, wherein the first signal conductor and the second signal conductor form a differential pair of conductors.

Example 7 includes the electrical interconnect of any one of examples 1 to 6, wherein the conductive reference layer is a first conductive reference layer and the electrical interconnect further comprises a second conductive reference layer mounted on the second dielectric layer, and wherein the first and second conductive reference layers do not cover the first and second signal conductors.

Example 8 includes the electrical interconnect of any one of examples 1 to 7, and further including a plurality of additional signal conductors, wherein each of the additional signal conductors is between the first dielectric layer and the second dielectric layer.

Example 9 includes the electrical interconnect of example 8, wherein each one of the plurality of additional signal conductors is part of a differential pair of signal conductors.

Example 10 includes the electrical interconnect of example 9, wherein each signal conductor is adjacent signal conductor to another signal conductor form a differential pair of signal conductors.

Example 11 includes the electrical interconnect of example 10, wherein the first and second conductive reference layers do not cover the signal conductors.

Example 12 includes the electrical interconnect of any one of examples 10-11, wherein the first and second first and second signal conductors are linear.

Example 13 includes the electrical interconnect of any one of examples 10-12, wherein the first and second conductive reference layers include bridge sections that periodically cover differential pairs of signal conductors.

Example 14 includes the electrical interconnect of any one of examples 10-13, wherein the bridge sections that periodically cover one differential pair of signal conductors are not aligned with the bridge sections that cover an adjacent differential pair of signal conductors.

Example 15 includes an electrical interconnect for an electronic package. The electrical interconnect includes a first dielectric layer; a second dielectric layer; an adhesive layer positioned between the first dielectric layer and the second dielectric layer; a plurality of signal conductors within the adhesive layer, wherein each signal conductor is part of a differential pair of signal conductors; a first conductive reference layer mounted on the first dielectric layer, wherein the first conductive reference layer does not cover the signal conductors; and a second conductive reference layer mounted on the second dielectric layer, wherein the second conductive reference layer does not cover the signal conductors.

Example 16 includes the electrical interconnect of example 15, wherein the signal conductors are linear.

Example 17 includes the electrical interconnect of any one of examples 15-16, wherein the first and second conductive reference layers include bridge sections that periodically cover the differential pairs of signal conductors.

Example 18 includes electronic system. The electronic system includes a first electronic component; a second electronic component; and an electrical interconnect that includes a first dielectric layer and a second dielectric layer, the electrical interconnect further including a differential pair of signal conductors that carry current between the first electronic component and the second electronic component, the electrical interconnect further including a first conductive reference layer mounted on the first dielectric layer and a second conductive reference layer mounted on the second dielectric layer such that the first and second conductive reference layers do not cover each of the signal conductors.

Example 19 includes the electrical interconnect of example 18, wherein the electrical interconnect includes an adhesive layer positioned between the first dielectric layer and the second dielectric layer, and wherein the signal conductors are within the adhesive layer.

Example 20 includes the electrical interconnect of any one of examples 18 to 19, wherein the electrical interconnect is mounted onto a flexible substrate that includes the first and second electronic components.

Example 21 includes the electrical interconnect of any one of examples 18 to 19, wherein the electrical interconnect is part of a flexible substrate that includes the first and second electronic components.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. In addition, the order of the methods described herein may be in any order that permits fabrication of an electrical interconnect and/or package that includes an electrical interconnect. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electrical interconnect for an electronic package, comprising:
a first dielectric layer;
a second dielectric layer;

an adhesive layer positioned between the first dielectric layer and the second dielectric layer;

a plurality of signal conductors within the adhesive layer, wherein each signal conductor is part of a differential pair of signal conductors;

a first conductive reference layer mounted on the first dielectric layer, wherein the first conductive reference layer does not cover the signal conductors; and a second conductive reference layer mounted on the second dielectric layer, wherein the second conductive reference layer does not cover the signal conductors, wherein the first and second conductive reference layers include bridge sections that periodically cover the differential pairs of signal conductors.

2. The electrical interconnect of claim 1, wherein the signal conductors are linear.

3. The electrical interconnect of claim 1, wherein the thickness of the first and second conductive reference layers is between 1.2 mils and 1.5 mils, and wherein the thickness of the first signal conductor and the second signal conductor is between 0.3 mils and 0.8 mils.

4. The electrical interconnect of claim 1, wherein the thickness of the first dielectric layer and the second dielectric layer is between 0.3 mils and 0.8 mils, and wherein the width of the first signal conductor and the second signal conductor may be between 1.0 mils and 1.5 mils.

5. The electrical interconnect of claim 1, wherein the spacing between the first signal conductor and the second signal conductor may be between 1.0 mils and 2.0 mils, and wherein the spacing between the first signal conductor and the second signal conductor and an adjacent differential pair of signals conductors may be between 3.0 mils and 6.0 mils.

6. An electronic system comprising:
a first electronic component;
a second electronic component; and
an electrical interconnect that includes a first dielectric layer and a second dielectric layer, the electrical interconnect further including a differential pair of signal conductors that carry current between the first electronic component and the second electronic component, the electrical interconnect further including a first conductive reference layer mounted on the first dielectric layer and a second conductive reference layer mounted on the second dielectric layer such that the first and second conductive reference layers do not cover each of the signal conductors, wherein the first and second conductive reference layers include bridge sections that periodically cover the differential pairs of signal conductors.

7. The electronic system of claim 6, wherein the electrical interconnect includes an adhesive layer positioned between the first dielectric layer and the second dielectric layer, and wherein the signal conductors are within the adhesive layer.

8. The electronic system of claim 6, wherein the electrical interconnect is mounted onto a flexible substrate that includes the first and second electronic components.

9. The electronic system of claim 6, wherein the electrical interconnect is part of a flexible substrate that includes the first and second electronic components.

* * * * *